Figure 1:
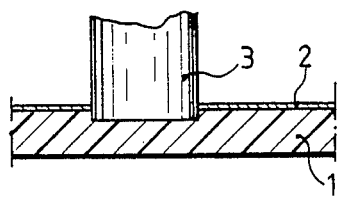

United States Patent [19]

Spierings

[11] Patent Number: 4,971,741
[45] Date of Patent: Nov. 20, 1990

[54] METHOD OF MAKING A LONG NARROW OPENING IN A LAYER OF ELECTRICALLY CONDUCTIVE MATERIAL ON A CARRIER OF A SYNTHETIC RESIN MATERIAL

[76] Inventor: Ferdinand H. F. G. Spierings, Asserpark II, 6706 HA, Wageningen, Netherlands

[21] Appl. No.: 215,825

[22] Filed: Jul. 6, 1988

[51] Int. Cl.$^5$ ............................................. C04B 35/00
[52] U.S. Cl. ..................................... 264/104; 83/171; 83/875; 264/154; 264/163
[58] Field of Search ............... 156/255, 254, 257, 267, 156/268; 83/875, 171; 409/304, 305, 318; 427/357; 30/169; 264/104, 154, 163

[56] References Cited

U.S. PATENT DOCUMENTS

| | | | |
|---|---|---|---|
| 2,157,151 | 4/1932 | Stackhouse | 83/171 |
| 4,083,390 | 4/1978 | Ingham | 83/875 X |
| 4,225,633 | 9/1980 | Spierings | 156/268 X |
| 4,306,928 | 12/1981 | Okui | 156/267 |
| 4,656,910 | 4/1987 | Peterson | 83/875 |
| 4,683,048 | 7/1987 | Yamada et al. | 83/875 X |

Primary Examiner—Michael W. Ball
Assistant Examiner—Mark a. Osele
Attorney, Agent, or Firm—Roylance, Abrams, Berdo & Goodman

[57] ABSTRACT

A method of forming a long narrow opening in a layer of electrically conductive material on a carrier of synthetic resin material. A cut, extending into the carrier, is made with a cutting tool having a temperature within the melting range of the material of the carrier. The cutting tool takes the form of a gouge which is disposed at an angle to the plane of the carrier with its concave side facing the carrier. The carrier performs a relative movement relative to the gouge in the direction of the concave side of the gouge.

The material removed from the layer of electrically conductive material is picked up by a pick-up device and removed from the gouge in the form of a ribbon.

6 Claims, 1 Drawing Sheet

METHOD OF MAKING A LONG NARROW OPENING IN A LAYER OF ELECTRICALLY CONDUCTIVE MATERIAL ON A CARRIER OF A SYNTHETIC RESIN MATERIAL

The invention relates to a method of making a long narrow opening in a layer of electrically conductive material on a carrier of a synthetic resin material, in which a cut, extending into the carrier, is made with a cutting tool having a temperature within the melting range of the material of the carrier.

In a similar method, disclosed in Netherlands patent No. 172,113, corresponding to U.S. Pat. No. 4,225,633, the cutting tool used is a pointed stylus. The pointed stylus is placed on the moving carrier under a certain pressure which is exerted on the stylus. As the carrier is moved relative to the stylus, an incision is made in the carrier. The heated stylus causes the surface of the synthetic resin material of the carrier to melt. An electrically conductive layer is applied to the carrier, for example, by vapor disposition of a silver dispersion. The conductive layer is present on the carrier as a porous coating. The melting of the synthetic resin causes the electrically conductive layer to mix with the molten resin and to be displaced laterally by the stylus. The lateral displacement causes elevations or ridges to be formed which project from the surface of the coating so that a rough surface is formed in the narrow opening made by the blunt stylus. In addition, there is the possibility that, after the passage of the stylus, some silver dispersion flows back into the opening made, resulting in the opening having narrowed portions. The result is, therefore, a rough and frayed incision and hence a rough and frayed ribbon.

It is an object of the present invention to provide a method which substantially overcomes the drawbacks outlined above. This object is achieved, in accordance with the present invention, by providing a method as described above, which is characterized in that the cutting tool is a gouge which is disposed at an angle to the plane of the carrier, with its concave side facing said carrier, said carrier performing a relative movement relative to the gouge in the direction of the concave side of the gouge, and in which the material removed from the layer of electrically conductive material is picked up by a pick-up device to remove such material from the gouge in the form of a ribbon.

In the method according to the present invention, as a result of the application of a gouge, in the manner described, and as a result of the specific disposition of the gouge, and the specific direction of movement of the carrier relative to the gouge, the gouge is not, as usual, used as a cutting tool, but rather as a scraping tool, so that the gouge, with its cutting angles, cuts a ribbon from the layer of electrically conductive material, which is discharged through the cavity of the gouge.

It is of importance that the ribbon is moved out of contact with the gouge as soon as possible so as to prevent an accumulation of the ribbon in the cavity of the gouge, and also to prevent the ribbon from melting on the contact plate owing to the high temperature of the gouge.

In order to ensure that the ribbon is discharged as fast as possible and does not break during the scraping action of the gouge, the strip discharged by the pick-up device is advantageously supplied to a winding drum, with the drum being rotated at a circumferential velocity substantially equalling the velocity at which the ribbon being removed is scraped off the carrier. An additional advantage is that the removed ribbon of material is actually recovered material. When the material of the ribbon largely consists of silver, this means a considerable saving of cost, as this silver can be re-used.

It is noted that the term "scraping" as used herein means the incising of the layer of electrically conductive material by the gouge, whereby, as a result of the high temperature, the ribbon of material to be cut from the layer comes to lie "loose" on the synthetic resin material of the carrier, so that the ribbon is lifted and removed from the synthetic resin material by the gouge.

In order that the scraping action may be as favourable as possible, in a preferred embodiment of the invention, the gouge is placed at such an angle that its sharp end is in contact with, and extends into, the material of the carrier throughout its entire length, and the angle is preferably 60° relative to the plane of the carrier.

Figure 2:
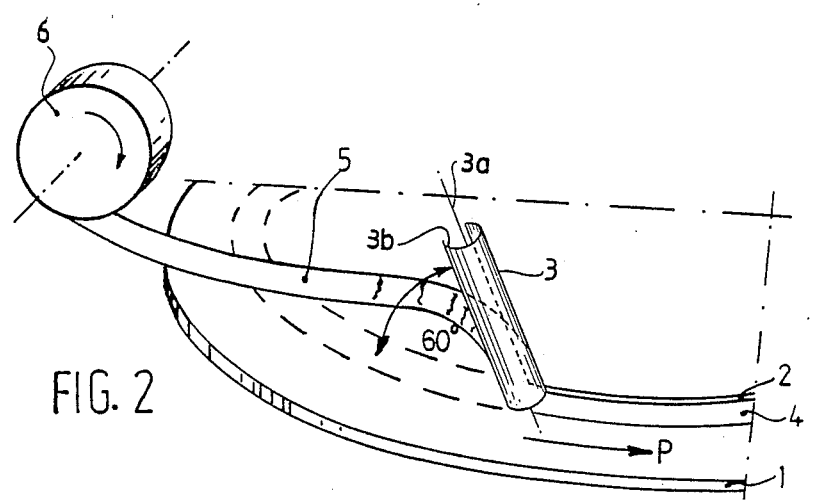
Figure 3:
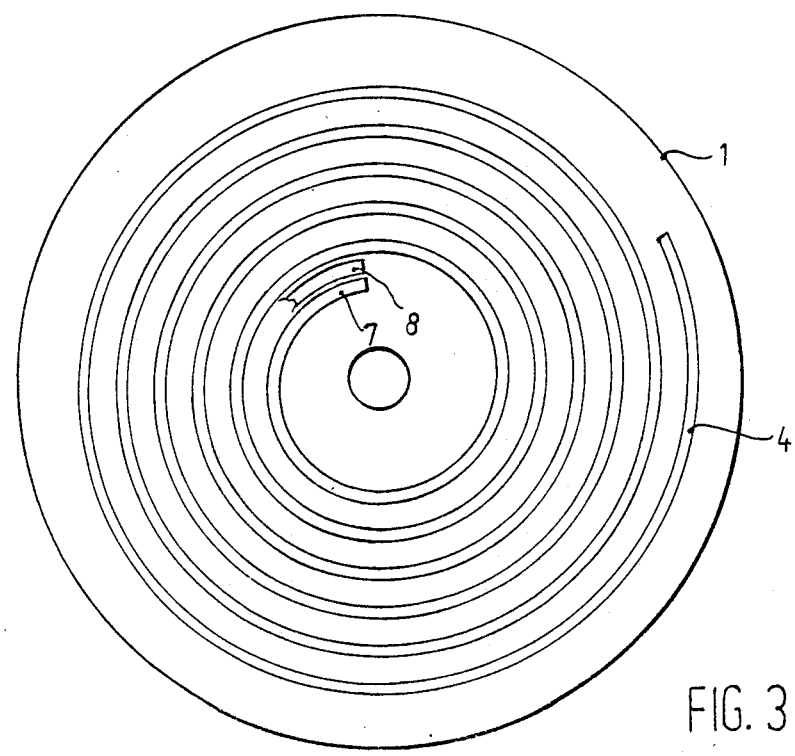

One embodiment of the invention will now be described in more detail, by way of example, with reference to the accompanying drawings. In said drawings:

FIG. 1 diagrammatically shows the way in which a carrier of synthetic resin material with a coating thereon is incised by a gouge;

FIG. 2 diagrammatically shows the way in which a ribbon of material is principally cut out from the coating by means of the gouge and removed;

FIG. 3 shows a disc-shaped carrier of synthetic resin material with a coating in which a spiral-shaped opening has been cut in accordance with FIGS. 1 and 2.

As shown in FIGS. 1 and 2, a carrier 1 of synthetic resin material, provided with an electrically conductive layer 2, for example, a layer of silver adhered to the synthetic resin material, is incised by means of a gouge 3. In order to make a long narrow opening 4 in layer 2, which opening 4 extends at least up to, or slightly into, the carrier, the gouge 3 is placed at an angle of, preferably, 60° relative to the plane of the carrier in such a manner that the gouge axis 3a is at an angle to the plane of the carrier, the concave side 3b of the gouge facing the plane of the carrier. The gouge is contacted with the layer 2 in accordance with a predetermined line. The temperature of the gouge is within the melting range of the synthetic resin material of the carrier. Furthermore, a certain pressure is exerted on the gouge. The gouge and the carrier are moved relative to each other in such a manner that the direction of movement P of the carrier is towards the concave side of the gouge. The conditions are chosen so that the sharp end of the gouge cuts through the conductive layer completely, but only cuts the synthetic resin material of the carrier located immediately therebelow to a slight depth in the direction of the carrier thickness.

As a result of the gouge 3 being at a temperature within the melting range of the synthetic resin material of the carrier, this material melts at the position of the gouge. In the position specified, the gouge acts as a "scraping" tool and not—as conventional—as a "cutting" tool. The two curved sharp edges of the gouge cut a ribbon 5 from the layer or coating 2, which ribbon is, as it were, peeled off from the subjacent molten synthetic resin material.

As shown by FIG. 2, the ribbon 5 being peeled off is moved away from the hollow side of gouge 3. When the leading edge of the ribbon 5 is picked up with a pick-up device not shown, for example, a rod with an adhesive, which is contacted with the leading edge of ribbon 5, the ribbon can be deflected away from the inside of the gouge immediately after being "peeled off" from the molten upper surface of the synthetic resin carrier 1, and be transferred to a winding drum 6.

The winding drum is rotated at a circumferential velocity substantially equal to the velocity at which the ribbon 5 is "scraped" from carrier 2. If the winding speed should be too low, the ribbon 5 may contact the hollow side of the gouge and melt. Too high a winding speed may cause the ribbon being wound to break, which may also entail the problem of the ribbon contacting the gouge. It is noted that an instantaneous contact of ribbon 5 with gouge 3 does not immediately cause the ribbon to be melt, as the material of layer 2 and that of carrier 1 generally have different melting temperatures.

A contact between ribbon 5 and gouge 3 may also be substantially prevented by placing gouge 3 at an angle of, for example, 60° to the plane of carrier 2 to provide sufficient space for the deflection of ribbon 5.

FIG. 3 shows how a spiral-shaped opening can be formed in coating 2 of the disc-shaped synthetic resin carrier 1 by means of the gouge. The width of opening 4 can be selected as desired by using a gouge of larger or smaller size. As a result of the fact that the sides of the opening are neatly cut off (there being no ridges and no frayed edges), the successive windings or turns of the spiral may be closely spaced. In the embodiment of FIG. 3, a second spiral opening 8, a portion of which is shown only, can be formed between the windings of spiral opening 4.

It will be clear that, in addition to spiral configurations, other configurations are possible and that, instead of a circular carrier, carriers of any other geometrical form, e.g., a rectangle, can be used.

Furthermore, it will be clear that synthetic resin carriers with a layer of electrically conductive material thereon, which is provided with a long narrow opening therein, produced by the method according to the present invention can be used for many purposes. Some of these are described in detail in the above Dutch patent No. 172,113, corresponding to U.S. Pat. No. 4,225,633, which, to the extent necessary, is incorporated herein by reference.

I claim:

1. A method of forming a long narrow groove in a layer of electrically conductive material on a carrier of synthetic resin material, comprising the steps of:
   locating a cutting tool, in the form of a gouge having an axis and a concave side terminating in a sharp end edge, with the axis at an angle to the plane of the carrier and with the gouge concave side facing the carrier;
   maintaining the sharp end edge at a temperature within the melting range of the carrier material;
   moving the carrier relative to the gouge in a direction of the gouge concave side forming a cut extending into the carrier;
   removing material from the layer of electrically conductive material, as a mixture of molten carrier material containing removed portions of the layer of electrically conductive material, during a scraping action of the gouge; and
   picking up the material, removed from the layer of electrically conductive material and the carrier, off the gouge in the form of a ribbon by a pick-up device, with the material removed being sticky, mainly immediately after leaving contact with the sharp end edge.

2. A method according to claim 1 wherein the ribbon removed by the pick-up device is conveyed to a winding drum; and
   the winding drum is rotated at a peripheral velocity equaling a velocity at which the ribbon being removed is scraped off from the carrier.

3. A method according to claim 2 wherein the gouge is placed at an angle to the carrier such that the entire length of the sharp end edge is in contact with and extends into the material of the carrier.

4. A method according to claim 1 wherein the gouge is placed at an angle to the carrier such that the entire length of the sharp end edge is in contact with and extends into the material of the carrier.

5. A method according to claim 4 wherein the axis of the gouge is located at an angle of about 60° relative to the plane of the carrier.

6. A method according to claim 3 wherein the axis of the gouge is located at an angle of about 60° relative to the plane of the carrier.

* * * * *